US012711600B2

(12) United States Patent
Kurosawa et al.

(10) Patent No.: US 12,711,600 B2
(45) Date of Patent: Aug. 18, 2026

(54) METHOD OF DETERMINING HYDROPHILICITY OF WAFER AND PROCESSING APPARATUS

(71) Applicant: DISCO CORPORATION, Tokyo (JP)

(72) Inventors: Ryosuke Kurosawa, Tokyo (JP); Soshi Ikeda, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 192 days.

(21) Appl. No.: 18/886,359

(22) Filed: Sep. 16, 2024

(65) Prior Publication Data

US 2025/0104213 A1 Mar. 27, 2025

(30) Foreign Application Priority Data

Sep. 21, 2023 (JP) ................................ 2023-155523

(51) Int. Cl.
*G06T 7/00* (2017.01)
*H10P 72/00* (2026.01)

(52) U.S. Cl.
CPC ........ *G06T 7/0004* (2013.01); *H10P 72/0411* (2026.01); *G06T 2207/20212* (2013.01); *G06T 2207/30148* (2013.01)

(58) Field of Classification Search
CPC .............. H10P 72/0411; H10P 72/0414; H10P 72/0604; G06T 2207/20212; G06T 7/0004;

(Continued)

(56) References Cited

U.S. PATENT DOCUMENTS 4,544,446 A * 10/1985 Cady .......................... C23F 1/08 438/758
6,562,398 B1 * 5/2003 Braach-Maksvytis ....................... B82Y 30/00 427/58

(Continued)

FOREIGN PATENT DOCUMENTS

CA 2547701 C * 2/2012 .......... B01L 3/50273
CN 103262231 A * 8/2013 .......... H10W 10/181

(Continued)

OTHER PUBLICATIONS

Ryo Nakagaki et al. , : "Automatic recognition of defect areas on a semiconductor wafer using multiple scanning electron microscope images," Jun. 10, 2009, Meas. Sci. Technol. 20 (2009) 075503, pp. 1-11.*

(Continued)

*Primary Examiner* — Omar S Ismail
(74) *Attorney, Agent, or Firm* — GREER BURNS & CRAIN, LTD.

(57) ABSTRACT

A method of determining the hydrophilicity of a wafer includes capturing an image of the entire upper surface of the wafer with a camera, forming a water film on the entire upper surface of the wafer, capturing a second image of the entire upper surface of the wafer with the camera after forming the water film, forming a differential image based on a difference between lightness of the first image and the lightness of the second image, and determining that the entire upper surface of the wafer is hydrophilic if the differential image is blank and that the entire upper surface of the wafer is not hydrophilic if otherwise.

5 Claims, 11 Drawing Sheets

(58) Field of Classification Search

CPC G06T 1/0021; G06T 3/06; G06T 3/04; G06T 3/14; G06T 3/40; G06T 3/60; G06T 5/20; G06T 5/73; G06T 5/90; G06T 7/0002; G06T 7/0012; G06T 7/10; G06T 7/20; G06T 7/30; G06T 7/40; G06T 7/50; G06T 7/60; G06T 7/70; G06T 7/80; G06T 9/00; G06T 11/20; G06T 11/60; G06T 13/20; G06T 15/50; G06T 15/10; G06T 17/20; G06T 2201/005; G06T 2207/10004; G06T 2207/10016; G06T 2207/10032; G06T 2207/10056; G06T 2207/10072; G06T 2207/10116; G06T 2207/10132; G06T 2207/10141; G06T 2207/20; G06T 2207/30; G06T 2207/30004; G06T 2207/30008; G06T 2207/30028; G06T 2207/30061; G06T 2207/30101; G06T 2207/30108; G06T 2207/30148; G06T 2207/30181; G06T 2207/30196; G06T 2207/30204; G06T 2207/30221; G06T 2207/30248; G06T 2211/40; G06T 2219/20

See application file for complete search history.

(56) References Cited

U.S. PATENT DOCUMENTS

| | | | | |
|---|---|---|---|---|
| 10,950,451 | B2 * | 3/2021 | Arakida | B24B 27/06 |
| 2003/0127333 | A1 * | 7/2003 | Lauks | G01N 33/6845 422/50 |
| 2006/0116002 | A1 * | 6/2006 | Kalkhoran | B82Y 10/00 977/840 |
| 2006/0219258 | A1 * | 10/2006 | Gast | H10P 72/0414 257/E21.228 |
| 2010/0043823 | A1 * | 2/2010 | Lee | G03F 7/425 134/1.3 |
| 2010/0105595 | A1 * | 4/2010 | Lee | C11D 3/323 510/176 |
| 2016/0237564 | A1 * | 8/2016 | Sieber | C23C 16/45525 |
| 2016/0237565 | A1 * | 8/2016 | Sieber | C23C 16/405 |
| 2016/0237567 | A1 * | 8/2016 | Sieber | C23C 16/45508 |
| 2016/0240419 | A1 * | 8/2016 | Sieber | C23C 16/4585 |
| 2019/0006212 | A1 * | 1/2019 | Lizuka | B24B 7/228 |
| 2019/0363068 | A1 * | 11/2019 | Hotta | H10W 90/00 |
| 2020/0185241 | A1 * | 6/2020 | Kunitake | H10P 72/0414 |
| 2021/0394384 | A1 * | 12/2021 | Fujita | B26D 1/15 |
| 2023/0415300 | A1 * | 12/2023 | Tateno | B24B 37/24 |

FOREIGN PATENT DOCUMENTS

| | | | | |
|---|---|---|---|---|
| JP | 2006295050 A | * 10/2006 | | |
| JP | 2008192854 A | * 8/2008 | | C01B 13/086 |
| JP | 2010267638 A | * 11/2010 | | |
| JP | 2011062739 A | * 3/2011 | | |
| JP | 2013161999 A | * 8/2013 | | |
| MY | 192234 A | * 8/2022 | | H10P 74/203 |

OTHER PUBLICATIONS

S.K Bag et al. , “6 Features of Surface Micromachining and Wafer Bonding Process,” 2006, Features of Surface Micromachining and Wafer Bonding Process, Micromanufacturing and Nanotechnology , Springer Berlin Heidelberg,2006,pp. 107-123).*

Jin-Goo Park et al., “Effects of Drying Methods and Wettability of Silicon on the Formation of Water Marks in Semiconductor Processing,” Jun. 1995, J. Electrochem. Soc., vol. 142, No. 6, Jun. 1995,pp. 2028-2031.*

Matthias Rudolph et al., “Introduction of an innovative water based photoresist stripping process using intelligent fluids,” Mar. 27, 2014, Proc. of SPIE vol. 9051,90510T-1-90510T-9.*

Kyu Min Sim et al., “Surfactant-Induced Solubility Control To Realize Water-Processed High-Precision Patterning of Polymeric Semiconductors for Full Color Organic Image Sensor,” Dec. 13, 2019, 2019 American Chemical Society, pp. 415-420.*

Noah Allen, “Using Near-Field Holography to Investigate Super Hydrophobic Surfaces,” 2004, 2008 NNIN REU Research Accomplishments,pp. 126-149.*

N.G. Shankar et al.,“Defect detection on semiconductor wafer surfaces,” Dec. 25, 2004, Microelectronic Engineering 77 (2005),pp. 337-345.*

* cited by examiner

START
WATER FILM FORMING STEP
REFLECTED LIGHT DETECTING STEP
DETERMINING STEP
END

CONTROLLER
DETERMINING SECTION
90
92
120
110
111
112
60
79
78
62
75
La
Lb
f
W
63
T
61A
61B
61
66
68
74
69
67
70
72
69a
69b
V1
V2
64
71
73
65
76
77

METHOD OF DETERMINING HYDROPHILICITY OF WAFER AND PROCESSING APPARATUS

BACKGROUND OF THE INVENTION

Field of the Invention

The present invention relates to a method of determining whether an entire upper surface of a wafer is hydrophilic or not and a processing apparatus for processing the wafer after confirming that the entire upper surface of the wafer is hydrophilic according to the determining method.

Description of the Related Art

According to a process of manufacturing semiconductor devices, a number of rectangular areas are demarcated on a face side of a semiconductor wafer shaped as a circular plate (hereinafter referred to as a "wafer") by a grid of projected dicing lines called streets established thereon, and devices such as integrated circuits (ICs) or large scale integration (LSI) circuits are constructed in the respective rectangular areas. Then, the wafer with the devices thereon is cut along the streets into a plurality of semiconductor chips by a cutting blade of a cutting apparatus called "dicing saw."

The cutting apparatus cuts the wafer while supplying the cutting blade with cutting water. It is customary to form a water film on the upper surface of the wafer for thereby preventing swarf from being attached to the upper surface of the wafer.

While cutting the water, the cutting apparatus moves a chuck table that is holding the wafer thereon in an X-axis direction, i.e., a cutting feed direction, with respect to the cutting blade. At this time, the movement of the chuck table is liable to break the water film on the upper surface of the wafer. When the water film is broken, the swarf tends to be attached to the upper surface of the wafer. If the swarf is attached to the upper surface of the wafer, then even when the upper surface of the wafer is thereafter washed by cleaning water by a cleaning unit, the attached swarf cannot be removed from the upper surface of the wafer.

JP 2006-295050A or JP 2010-267638A discloses a method of continuously forming a water film on the upper surface, i.e., the cut surface, of a wafer by applying ultraviolet rays to the upper surface of the wafer to generate ozone and generating active oxygen to make the upper surface of the wafer hydrophilic. According to JP 2013-161999A, it has been proposed to irradiate the upper surface, i.e., the cut surface, of a wafer with a plasma to make the upper surface of the wafer hydrophilic.

SUMMARY OF THE INVENTION

However, though the upper surface of the wafer may be made hydrophilic by the methods disclosed by the above prior art references, there has been available in the art no means for confirming whether the entire upper surface of the wafer is hydrophilic or not. As a result, swarf may possibly be left on portions of the upper surface of the wafer.

It is therefore an object of the present invention to provide a method of determining the hydrophilicity of a wafer to confirm with ease whether the entire upper surface of the wafer is hydrophilic or not and a processing apparatus that is capable of reliably preventing swarf from being attached to the upper surface of the wafer.

In accordance with a first aspect of the present invention, there is provided a method of determining whether an entire upper surface of a wafer is hydrophilic or not. The method includes a first image capturing step of capturing an image of the entire upper surface of the wafer with a camera, a water film forming step of supplying an amount of water enough to form a water film on the entire upper surface of the wafer and rotating the wafer about an axis at a center of the wafer at a predetermined rotational speed, after the water film forming step, a second image capturing step of capturing a second image of the entire upper surface of the wafer with the camera, a differential image forming step of forming a differential image based on a difference between lightness of the first image captured in the first image capturing step and lightness of the second image captured in the second image capturing step, and a determining step of determining that the entire upper surface of the wafer is not hydrophilic if the differential image contains a portion that is not blank and that the entire upper surface of the wafer is hydrophilic if the differential image is blank.

In accordance with a second aspect of the present invention, there is provided a method of determining whether an entire upper surface of a wafer is hydrophilic or not. The method includes a water film forming step of supplying an amount of water enough to form a water film on the entire upper surface of the wafer and rotating the wafer about an axis at a center of the wafer at a predetermined rotational speed, after the water film forming step, a reflected light detecting step of moving a reflective sensor in a direction parallel to the upper surface of the wafer and simultaneously detecting reflected light that is reflected by the upper surface of the wafer or water on the upper surface of the wafer from measuring light applied from the reflective sensor to the wafer, and a determining step of determining that the entire upper surface of the wafer is hydrophilic if the amount of light detected by the reflective sensor in the reflected light detecting step is of a value higher than a preset threshold value and that the entire upper surface of the wafer is not hydrophilic if at least part of the detected amount of light is of a value lower than the threshold value.

In accordance with a third aspect of the present invention, there is provided a processing apparatus. The processing apparatus includes a chuck table for holding a wafer thereon, a processing unit for processing the wafer held on the chuck table, a cleaning unit for cleaning an upper surface of the wafer by ejecting cleaning water to the upper surface of the wafer while rotating the wafer held on a cleaning table thereof, a controller, and a determining unit for supplying water to a central area of the wafer held on the chuck table or the cleaning table, then rotating the chuck table or the cleaning table to form a water film on the entire upper surface of the wafer, and thereafter determining whether the entire upper surface of the wafer is hydrophilic or not.

In the method of determining whether the wafer is hydrophilic or not according to the first aspect, it is determined that the entire upper surface of the wafer is not hydrophilic if the differential image based on the difference between lightness of the first image captured in the first image capturing step and lightness of the second image captured in the second image capturing step contains a portion that is not blank, and that the entire upper surface of the wafer is hydrophilic if the differential image is blank. Consequently, it is easy to confirm whether the entire upper surface of the wafer is hydrophilic or not.

In the method of determining whether the wafer is hydrophilic or not according to the second aspect, it is determined that the entire upper surface of the wafer is hydrophilic if the amount of light detected by the reflective sensor in the reflected light detecting step is of a value higher than a preset threshold value and that the entire upper surface of the wafer is not hydrophilic if at least part of the detected amount of light is of a value lower than the threshold value. Consequently, it is easy to confirm whether the entire upper surface of the wafer is hydrophilic or not.

The processing apparatus according to the third aspect performs predetermined processing on the wafer after having confirmed that the entire upper surface of the wafer is hydrophilic by the determining method according to the first aspect or the second aspect. When the upper surface of the wafer is cleaned by the cleaning unit after the wafer has been processed, swarf deposited on the upper surface of the wafer is reliably washed away by the cleaning water and hence is reliably prevented from being attached to the upper surface of the wafer.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Preferred embodiments of the present invention will be described below with reference to the accompanying drawings. The embodiments of the present invention may also be referred to as aspects of the present invention. First, a cutting apparatus as a form of a processing apparatus according to the present invention will be described below.

The cutting apparatus will be described below with reference to FIG. 1 in reference to a three-dimensional XYZ coordinate system having an X-axis, a Y-axis, and a Z-axis. The X-axis extends horizontally forwardly and rearwardly in a +X direction and a −X direction, i.e., in cutting feed directions, and the Y-axis extends horizontally leftwardly and rightwardly in a +Y direction and a −Y direction, i.e., in indexing feed directions perpendicularly to the X-axis. The Z-axis extends vertically upwardly and downwardly in a +Z direction and a −Z direction, i.e., in incising feed directions, perpendicularly to the X-axis and the Y-axis.

Figure 1:
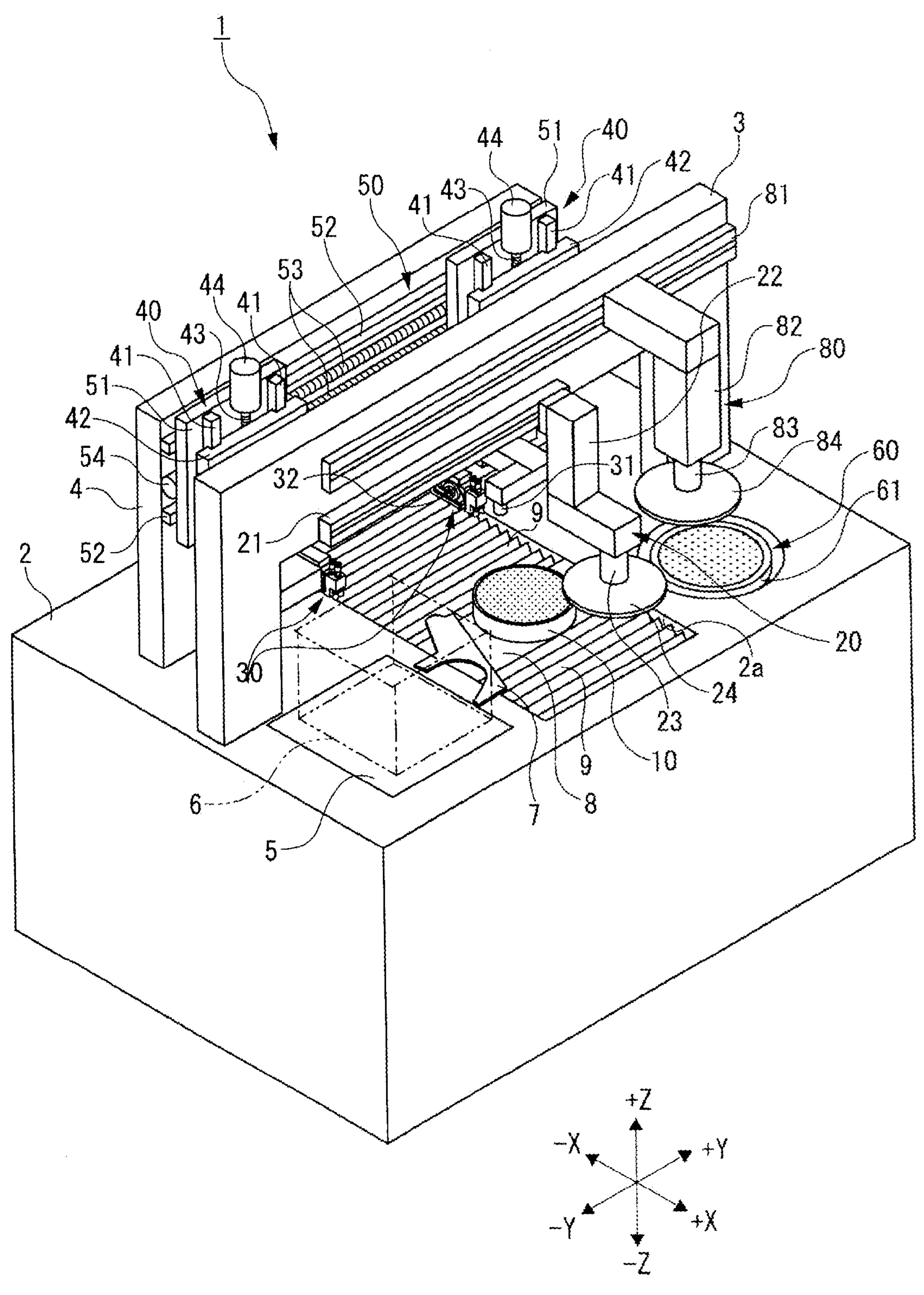
FIG. 1 is a perspective view of a cutting apparatus as a form of a processing apparatus according to the present invention.

The cutting apparatus, denoted by 1 in FIG. 1, is referred to as a dual dicer and includes a base 2 that supports various components of the cutting apparatus 1 thereon. The cutting apparatus 1 also has two vertical portal-shaped upstanding columns 3 and 4 mounted on the upper surface of a rear portion of the base 2 that deviates in the −X direction from its center. The columns 3 and 4, also referred to as front and rear columns 3 and 4, are elongate leftwardly and rightwardly along the Y-axis and parallel to each other, and are spaced from each other along the X-axis.

The base 2 has a rectangular opening 2*a*, elongates forwardly and rearwardly in a +X direction and a −X direction, defined therein that is open in the upper surface of a central portion thereof along the Y-axis. A cassette support table 5 is disposed on a front corner of the upper surface of the base 2 that deviates in the +X direction from its center on the left side of the opening 2*a* that deviates in the −Y direction from the opening 2*a*. The cassette support table 5 can be lifted and lowered vertically along the Z-axis by a lifting and lowering mechanism, not depicted. A rectangular box-shaped cassette 6 that houses a plurality of disk-shaped wafers W (see FIG. 2) as workpieces therein is placed on the upper surface of the cassette support table 5. An unloading and loading mechanism 7 for unloading and loading wafers W from and into the cassette 6 is disposed in the vicinity of the cassette 6 on one side thereof near the opening 2*a*. In FIG. 1, only a contour of the cassette 6 is indicated by the two-dot-and-dash lines for illustrative purposes.

Moreover, the cutting apparatus 1 includes as major components a rotatable chuck table 10 for holding a wafer W as a workpiece on a holding surface thereof, a first delivery mechanism 20 for receiving a wafer W unloaded from the cassette 6 by the unloading and loading mechanism 7 and delivering the wafer W to the holding surface of the chuck table 10, a pair of left and right cutting units 30 as processing mechanisms for cutting the wafer W held on the holding surface of the chuck table 10, a pair of left and right Z-axis moving mechanisms, i.e., incising feed mechanisms, 40 for selectively lifting and lowering the respective cutting units 30 in the +Z direction and the −Z direction, i.e., in the incising feed directions, a pair of Y-axis moving mechanisms, i.e., indexing feed mechanisms, 50 for moving the respective cutting units 30 reciprocably in the +Y direction and the −Y direction, i.e., in the indexing feed directions, forming a water film on an entire upper surface of the wafer W before the wafer W is cut, a cleaning unit 60 for cleaning the upper surface of the wafer W that has been cut by the cutting units 30, a second delivery mechanism 80 for delivering the wafer W between the chuck table 10 and the cleaning unit 60, and a controller 90 (see FIG. 4) for controlling the components of the cutting apparatus 1. The cutting apparatus 1 also includes an X-axis moving mechanism, i.e., a cutting feed mechanism, for moving the chuck table 10 in the +X direction and the −X direction, i.e., in the cutting feed directions. However, as the X-axis moving mechanism includes a known ball screw mechanism, it will be omitted from detailed description and illustration.

Structural details of the chuck table 10, the first delivery mechanism 20, the cutting units 30, the Z-axis moving mechanisms 40, the Y-axis moving mechanisms 50, the cleaning unit 60, the second delivery mechanism 80, and the controller 90 as the main components of the cutting apparatus 1 will be described below.

The chuck table 10 includes a circular plate rotatably disposed substantially centrally over the opening 2*a* defined in the base 2 and having an upper surface as the holding surface for holding the wafer W (see FIG. 2) thereon. The holding surface of the chuck table 10 is selectively fluidly connected to a suction source, not depicted.

The chuck table 10 is supported on the X-axis moving mechanism, not depicted, by a rotating mechanism, not depicted, disposed beneath the chuck table 10. Specifically, the chuck table 10 is rotatable about a vertical central axis thereof by the rotating mechanism, and is reciprocably movable in the +X direction and the −X direction, i.e., in the cutting feed directions, by the X-axis moving mechanism that is disposed beneath the chuck table 10. The rectangular opening 2*a* that is open in the upper surface of the base 2 and that extends around the chuck table 10 is covered with a cover 8 shaped as a rectangular plate movable with the chuck table 10. The cover 8 over the opening 2*a* has both sides extending from the chuck table 10 respectively in the +X direction and the −X direction and covered respectively with bellows-shaped covers 9 that can be extended and contracted as the cover 8 moves in the +X direction and the −X direction.

Figures 2, 3:
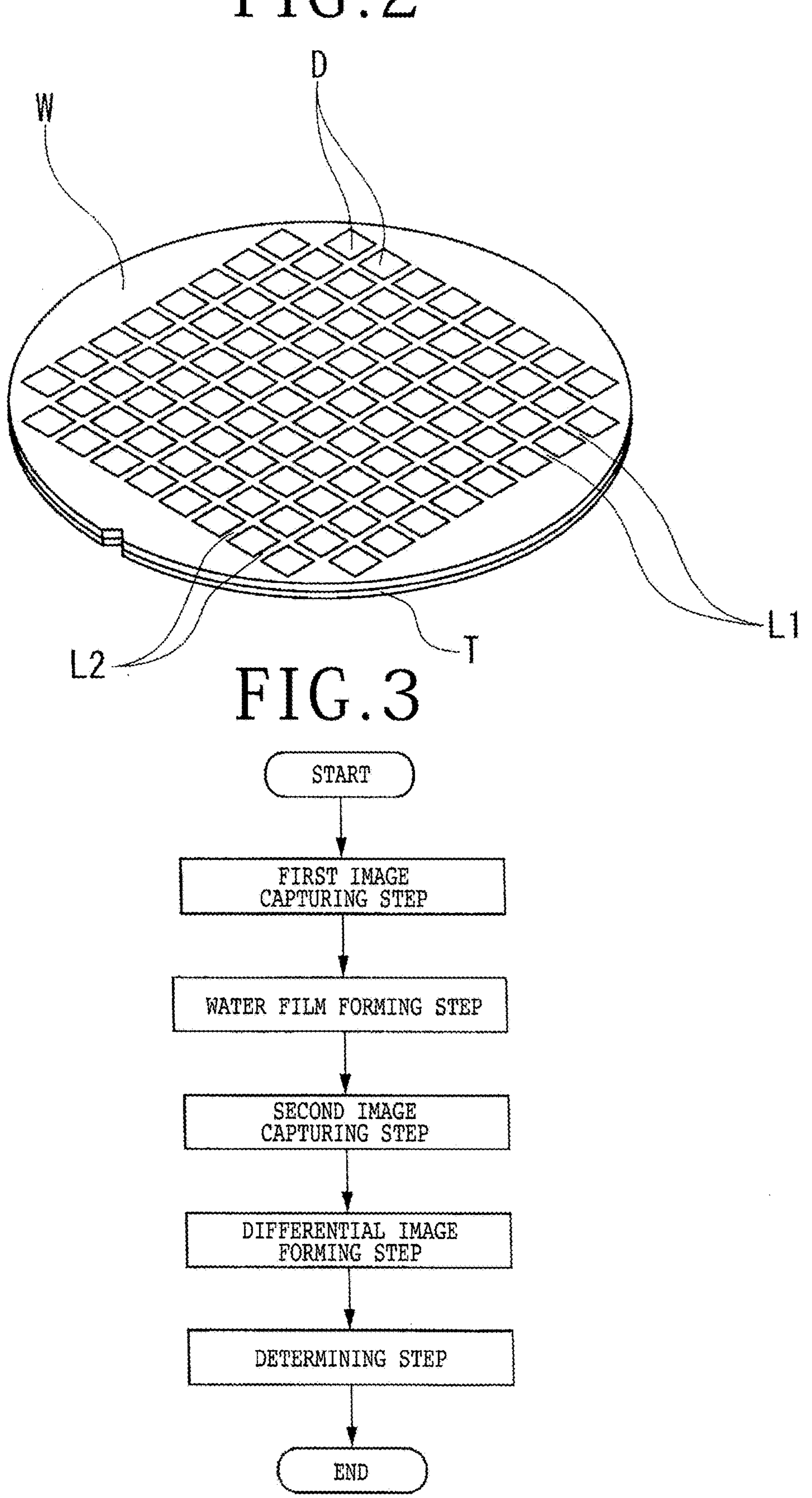
FIG. 2 is a perspective view of a wafer.
FIG. 3 is a flowchart illustrating a sequence of the steps of a method of determining the hydrophilicity of a wafer according to a first aspect of the present invention.

The wafer W is shaped as a thin circular plate made of monocrystalline silicon (Si), for example. As illustrated in FIG. 2, the wafer W has a face side, i.e., an upper surface in FIG. 2, including a number of rectangular areas demarcated thereon by a grid of projected dicing lines L1 and L2 called streets established thereon, and devices D such as ICs or LSI circuits are constructed in the respective rectangular areas. A dicing tape T is affixed to a reverse side, i.e., a lower surface in FIG. 2, opposite the face side, of the wafer W. The wafer W may alternatively be made of silicon carbide (SiC), glass, ceramic, or sapphire, for example.

As illustrated in FIG. 1, the first delivery mechanism 20 receives a wafer W unloaded from the cassette 6 by the unloading and loading mechanism 7 and delivers the wafer W to the holding surface of the chuck table 10. The first delivery mechanism 20 includes an L-shaped arm 22 movable leftwardly and rightwardly along the Y-axis along a guide rail 21 mounted on the front column 3 and extending leftwardly and rightwardly along the Y-axis, and a suction pad 24 shaped as a circular plate mounted on the lower end of a shaft 23 extending vertically downwardly from a lower tip end of the arm 22.

The cutting units 30 are vertically movable along the Z-axis, i.e., the incising feed directions, respectively by the Z-axis moving mechanisms 40 and also horizontally movable along the Y-axis, i.e., the indexing feed directions, respectively by the Y-axis moving mechanisms 50. Since the cutting units 30 are basically structurally identical to each other, only one of them will be described in detail below.

The cutting unit 30 is mounted in combination with a camera 31 as image capturing means on a lower portion of a Z-axis base 42, to be described later, of each of the Z-axis moving mechanisms 40. The cutting unit 30 includes a circular cutting blade 32 mounted on the tip end of a spindle, not depicted, extending along the Y-axis. The spindle and hence the cutting blade 32 are rotatable at a high speed by a spindle motor, not depicted, coupled as a rotary actuator thereto. The cutting blade 32 has an annular base including an outer circumferential cutting edge that is made of abrasive grains of diamond that are bound together by a binder such as a resin bond, a metal bond, or a vitrified bond, for example.

The camera 31 as the image capturing means captures an image of the face side of the wafer W held on the holding surface of the chuck table 10 for detecting the positions of the projected dicing lines L1 and L2 (see FIG. 2) by performing image processing such as pattern matching on the captured image. The camera 31 includes an image capturing device such as a charge coupled device (CCD) image sensor or a complementary metal oxide semiconductor (CMOS) image sensor, for example.

The Z-axis moving mechanisms 40 refer to mechanisms for moving the cutting units 30 along the Z-axis, i.e., along the incising geed directions, independently of each other. The Z-axis moving mechanisms 40 are mounted on the rear column 4 that is disposed behind the front column 3 in the −X direction. Each of the Z-axis moving mechanisms 40 includes a pair of Z-axis guide rails 41 vertically disposed on a face side of a Y-axis base 51, to be described later, of one of the Y-axis moving mechanisms 50 and spaced from each other along the Y-axis, a Z-axis base 42 slidably mounted on the Z-axis guide rails 41 for vertical movement along the Z-axis and hence the Z-axis guide rails 41, a Z-axis ball screw 43 vertically disposed between the Z-axis guide rails 41 and rotatable about its vertical central axis, and a reversible Z-axis servomotor 44 coupled to the upper end of the Z-axis ball screw 43 for rotating the Z-axis ball screw 43 about the vertical central axis thereof. The cutting unit 30 is mounted on the lower portion of the Z-axis base 42 as described above. A nut, not depicted, is mounted on a reverse side of the Z-axis base 42 and operatively threaded over the Z-axis ball screw 43.

When the Z-axis servomotor 44 is energized, it rotates the Z-axis ball screw 43 in one direction about its vertical central axis, causing the nut and hence the Z-axis base 42 to move in the +Z direction or the −Z direction along the Z-axis. When the Z-axis servomotor 44 is reversed, it rotates the Z-axis ball screw 43 in the opposite direction about its vertical central axis, causing the nut and hence the Z-axis base 42 to move in the −Z direction or the +Z direction along the Z-axis. The two Z-axis moving mechanisms 40 are independently operable to move the respective cutting units 30 along the Z-axis guide rails 41 independently of each other vertically in the incising feed directions along the Z-axis.

The Y-axis moving mechanisms 50 refer to mechanisms for moving the respective cutting units 30 reciprocably in the indexing feed directions along the Y-axis independently of each other. The Y-axis moving mechanisms 50 together with the Z-axis moving mechanisms 40 are mounted on the rear column 4. The Y-axis moving mechanisms 50 include respective Y-axis bases 51 that are movable along the Y-axis along a pair of upper and lower Y-axis guide rails 52 that are mounted on a front surface of the rear column 4 and extend parallel to each other along the Y-axis.

The Y-axis moving mechanisms 50 further include a pair of respective upper and lower Y-axis ball screws 53 disposed between the upper and lower Y-axis guide rails 52 and extending along the Y-axis. The Y-axis ball screws 53 are rotatable about their horizontal central axes. The Y-axis ball screws 53 are operatively threaded through respective nuts, not depicted, mounted on reverse sides of the respective Y-axis bases 51. The Y-axis ball screws 53 have respective axial ends coupled to Y-axis servomotors 54 (one illustrated in FIG. 1) as rotary actuators.

When the Y-axis servomotors 54 are energized, they rotate the corresponding Y-axis ball screws 53 in one direction about their horizontal central axes, causing the nuts and hence the Y-axis bases 51 together with the Z-axis bases 42 to move along the Y-axis guide rails 52 in one of the indexing feed directions along the Y-axis. When the Y-axis servomotors 54 are reversed, they rotate the Y-axis ball screws 53 in the opposite direction about their vertical central axes, causing the nuts and hence the Y-axis bases 51 to move along the Y-axis guide rails 52 in the other indexing feed direction along the Y-axis. The two Y-axis moving mechanisms 50 are independently operable to move the respective cutting units 30 along the Y-axis guide rails 52 independently of each other horizontally in the indexing feed directions along the Y-axis.

As described above, in the cutting apparatus 1 illustrated in FIG. 1, the chuck table 10 and the wafer W held thereon are movable in the cutting feed directions along the X-axis, and the cutting units 30 and the cameras 31 are movable in the indexing feed directions along the Y-axis and in the incising feed directions along the Z-axis.

The cleaning unit 60 functions to form a water film f (see FIG. 6) on an entire upper surface of the wafer W before the wafer W is cut and to clean the upper surface of the wafer W after the wafer W is cut. As illustrated in FIG. 1, the cleaning unit 60 is disposed in the upper surface of the base 2 on the right side of the opening 2*a* and spaced laterally from a front portion of the opening 2*a*. As illustrated in FIGS. 4 through 7, the cleaning unit 60 includes a cleaning table 61 rotatable about its vertical central axis while holding the wafer W under suction thereon and a nozzle 62 disposed above the cleaning table 61 for supplying water, i.e., pure water, from above to the wafer W held under suction on the cleaning table 61.

The cleaning table 61 is shaped as a circular plate including an upper frame 61A and lower support plate 61B that are joined integrally together. The upper frame 61A has a central recess defined therein that houses a porous member 63 shaped as a circular plate and made of porous ceramic. The porous member 63 has an upper surface acting as a holding surface for holding the wafer W thereon.

The cleaning unit 60 also includes a servomotor 64 as a rotary actuator and an encoder 65 for detecting the direction in which the servomotor 64 rotates its motor shaft or rotational shaft 66 and the rotational speed of the output shaft of the servomotor 64. The servomotor 64 and the encoder 65 are disposed below the cleaning table 61. The cleaning table 61 has a central portion fixed to the upper end of the motor shaft 66 that extends vertically upwardly from the servomotor 64. A rotary joint 67 is mounted on an intermediate portion of the motor shaft 66. When the servomotor 64 is energized, it rotates the motor shaft 66 about its vertical central shaft, transmitting its rotation to the cleaning table 61, which is rotated about its central axis at a predetermined speed. The servomotor 64 and the encoder 65 are electrically connected to the controller 90.

The cleaning table 61, the motor shaft 66, and the rotary joint 67 have a fluid communication passage 68 defined therein. The fluid communication passage 68 has an end, i.e., an upper end, open at the lower surface of the porous member 63, an L-shaped portion extending in the rotary joint 67, and another end, i.e., a lower end, connected to a pipe 69 that branches into two branch pipes 69*a* and 69*b*. The branch pipe 69*a* is fluidly connected via a variable orifice 70 and an on-off valve V1 to a suction source 71, whereas the branch pipe 69*b* is fluidly connected via a variable orifice 72 and an on-off valve V2 to an air supply source 73. To the pipe 69, there is connected a pressure gage 74 that measures the pressure of air flowing in the pipe 69. The on-off valves V1 and V2 are electrically connected to the controller 90 that controls the way in which the on-off valves V1 and V2 are opened and closed.

A rotatable shaft 75 that can be turned about its vertical central axis, a servomotor 76 for turning the rotatable shaft 75 about its vertical central axis, and an encoder 77 for detecting the direction in which the servomotor 76 rotates its motor shaft and the rotational speed of the motor shaft of the servomotor 76 are disposed on one side of the cleaning table 61. The rotatable shaft 75, the servomotor 76, and the encoder 77 are vertically arranged successively in vertically alignment with each other. A turn arm 78 extends horizontally from the upper end of the rotatable shaft 75. The nozzle 62 that is oriented vertically is attached to the distal end of the turn arm 78. A water supply source 79 is fluidly connected to the nozzle 62. When the servomotor 76 is energized, it turns the rotatable shaft 75 through a predetermined angle of 90°, causing the turn arm 78 and the nozzle 62 on its distal end to swing horizontally about the vertical central axis of the rotatable shaft 75 between a retracted position illustrated in FIG. 4 and a water supply position illustrated in FIG. 5. The turn arm 78 has such a length that when the turn arm 78 is in the water supply position illustrated in FIG. 5, a water ejection port, not depicted, that is open at the lower surface of the nozzle 62 is positioned over a central area of the wafer W placed on the cleaning table 61. The servomotor 64 and the encoder 65 are electrically connected to the controller 90.

The second delivery mechanism 80 performs a function to deliver the wafer W between the chuck table 10 and the cleaning table 61 of the cleaning unit 60. The second delivery mechanism 80 includes an L-shaped arm 82 movable along the Y-axis along a guide rail 81 disposed on a front surface of the front column 3 and extending along the Y-axis and a suction pad 84 shaped as a circular plate mounted on the lower end of a shaft 83 extending vertically downwardly from a lower tip end of the arm 82.

Figure 4:
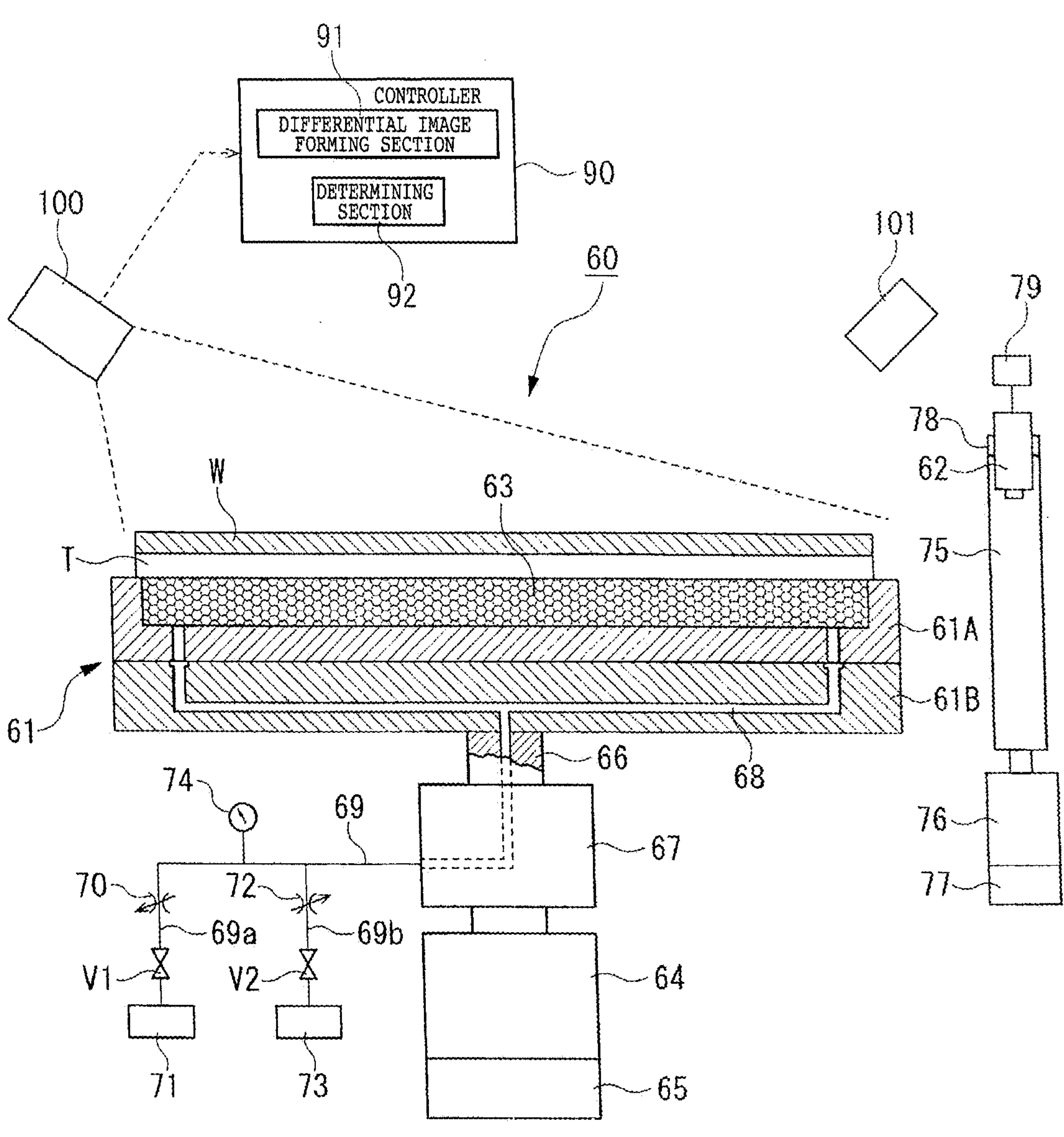
FIG. 4 is a side elevational view, partly in cross section, illustrating a first image capturing step of the method of determining the hydrophilicity of a wafer according to the first aspect.

The controller 90 that controls the components of the cutting apparatus 1 includes a central processing unit (CPU) for performing processing operations according to control programs and a storage unit such as a read only memory (ROM) and a random access memory (RAM). According to the present embodiments, the controller 90 performs a function to determine whether the entire upper surface of the wafer W is hydrophilic or not by way of image processing. As illustrated in FIG. 4, the controller 90 includes a differential image forming section 91 and a determining section 92. Details of the differential image forming section 91 and the determining section 92 will be described later.

Now, a method of determining the hydrophilicity of a wafer W according to a first aspect of the present invention, carried out by the cutting apparatus 1 thus arranged, will be described below. As illustrated in FIG. 3, the determining method includes 1) a first image capturing step, 2) a water film forming step, 3) a second image capturing step, 4) a differential image forming step, and 5) a determining step that are performed successively to determine whether the entire upper surface of the wafer W is hydrophilic or not. The first image capturing step, the water film forming step, the second image capturing step, the differential image forming step, and the determining step of the method according to the first aspect will be described below with reference to FIGS. 4 through 9.

1) First Image Capturing Step:

As illustrated in FIG. 4, the first image capturing step is a step of capturing, with a camera 100, a first image of the entire upper surface of the wafer W held on the cleaning table 61 of the cleaning unit 60. Specifically, in the first image capturing step, the unloading and loading mechanism 7 unloads a wafer W from the cassette 6 and transfers the wafer W to the first delivery mechanism 20. The first delivery mechanism 20 delivers the wafer W to the chuck table 10 with the suction pad 24 and places the wafer W onto the holding surface of the chuck table 10 with the dicing tape T facing downwardly. The wafers W housed in the cassette 6 have had their entire face sides made hydrophilic by being irradiated with ultraviolet rays by ultraviolet ray applying means, not depicted, disposed in the cassette 6. Alternatively, the entire face sides of the wafers W may be made hydrophilic by being irradiated with a plasma rather than ultraviolet rays.

According to the present embodiments or the first aspect, the camera 100 and the differential image forming section 91 and the determining section 92 of the controller 90 jointly make up a determining unit.

Then, the second delivery mechanism 80 holds the wafer W on the chuck table 10 under suction on the suction pad 84, delivers the wafer W to the cleaning unit 60, and places the wafer W onto the cleaning table 61. Then, the controller 90 opens the on-off valve V1 while keeping the on-off valve V2 closed. As a result, air in the porous member 63 of the cleaning table 61 is drawn through the fluid communication passage 68 by the suction source 71, developing a negative pressure in the porous member 63 to attract the wafer W under suction on the holding surface of the cleaning table 61 with the dicing tape T facing downwardly against the holding surface (step S1 in FIG. 9).

Figure 9:
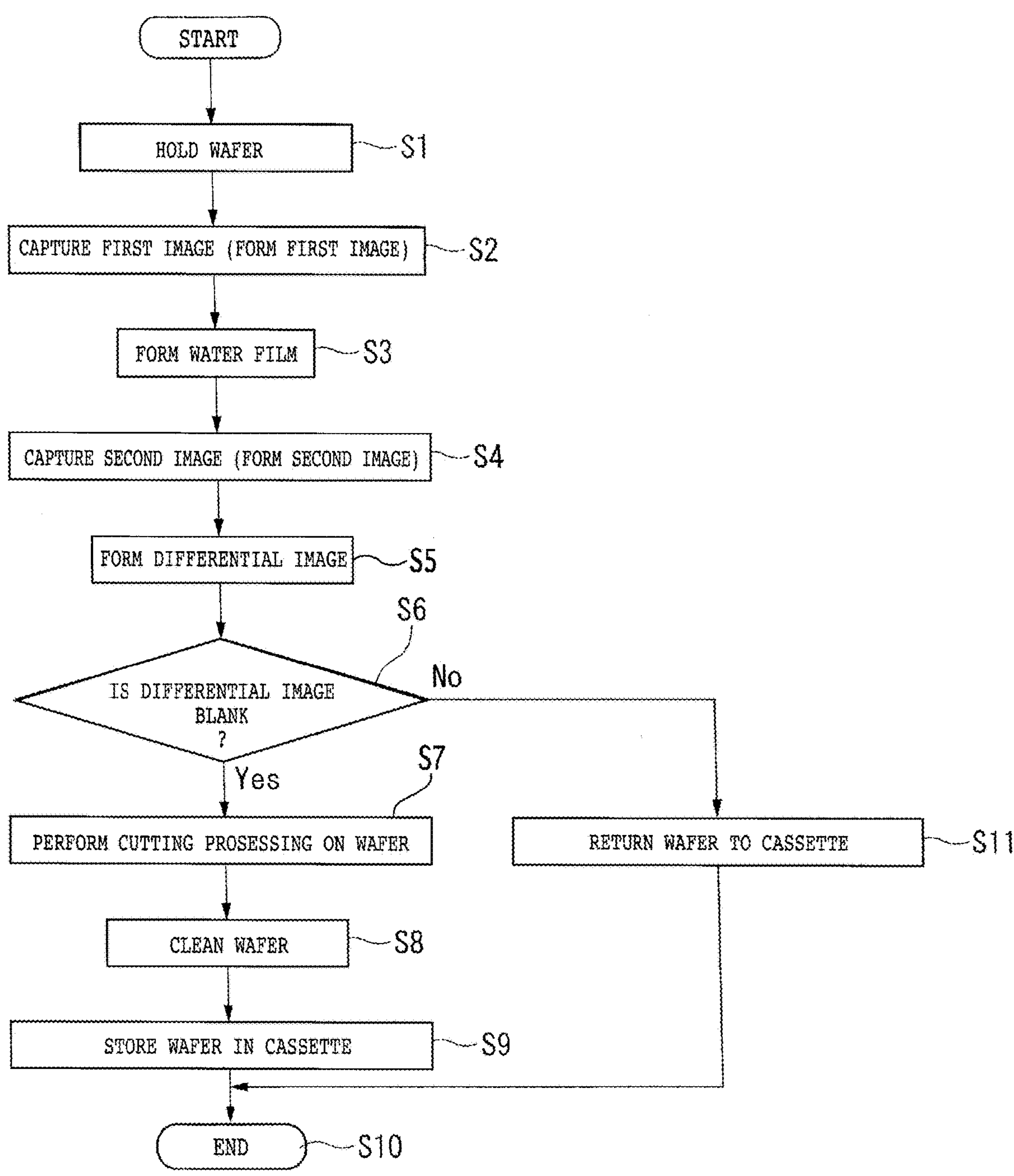
FIG. 9 is a flowchart illustrating a sequence of the steps of the method of determining the hydrophilicity of a wafer according to the first aspect and a cutting method.

Thereafter, as illustrated in FIG. 4, while the entire face side, i.e., upper surface, of the wafer W is being illuminated by an illuminating device 101 obliquely from above the wafer W, the camera 100 captures a first image of the entire upper surface of the wafer W obliquely from above the wafer W, and stores the first image in the storage unit of the controller 90 (step S2 in FIG. 9). In the first image capturing step, the nozzle 62 and the turn arm 78 are kept in the retracted position on one side of the cleaning table 61.

Figure 5:
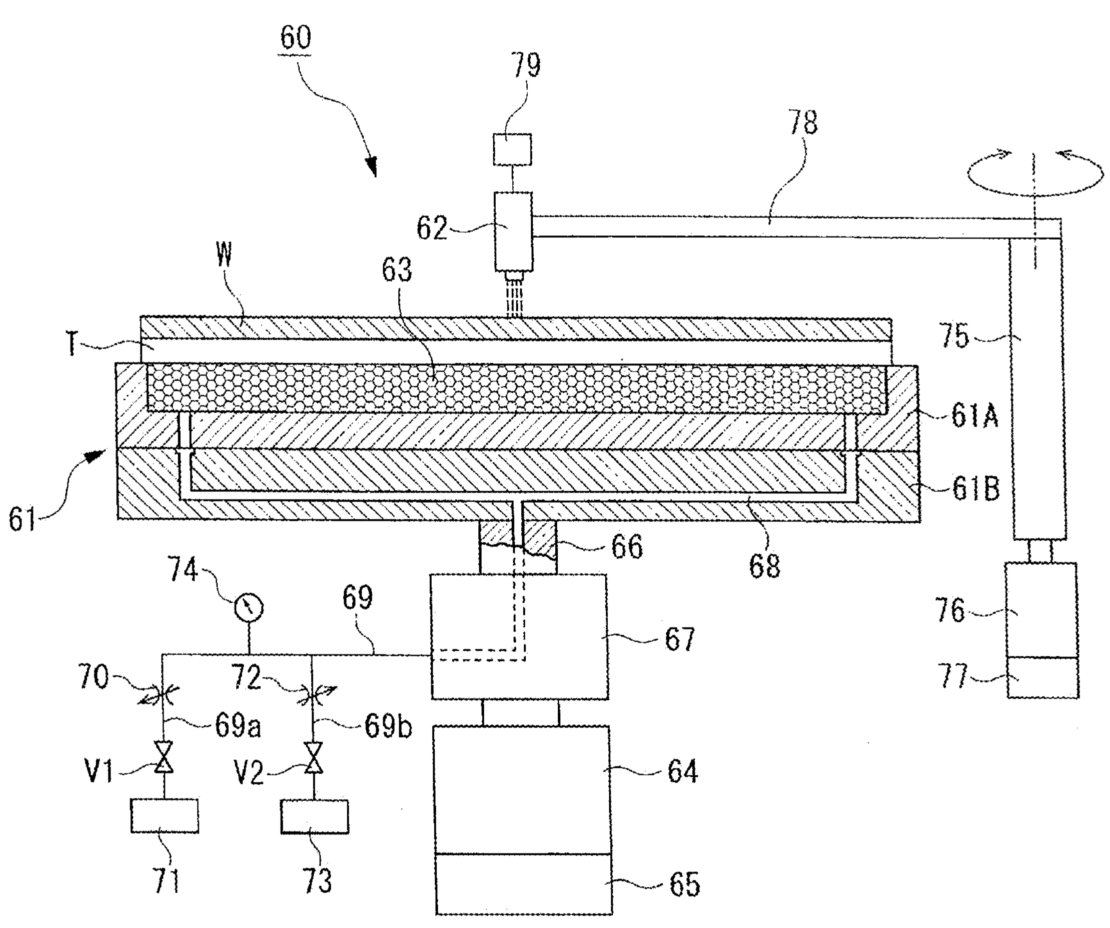
FIG. 5 is a side elevational view, partly in cross section, illustrating a water film forming step, i.e., a water supplying step, of the method of determining the hydrophilicity of a wafer according to the first aspect.
Figure 6:
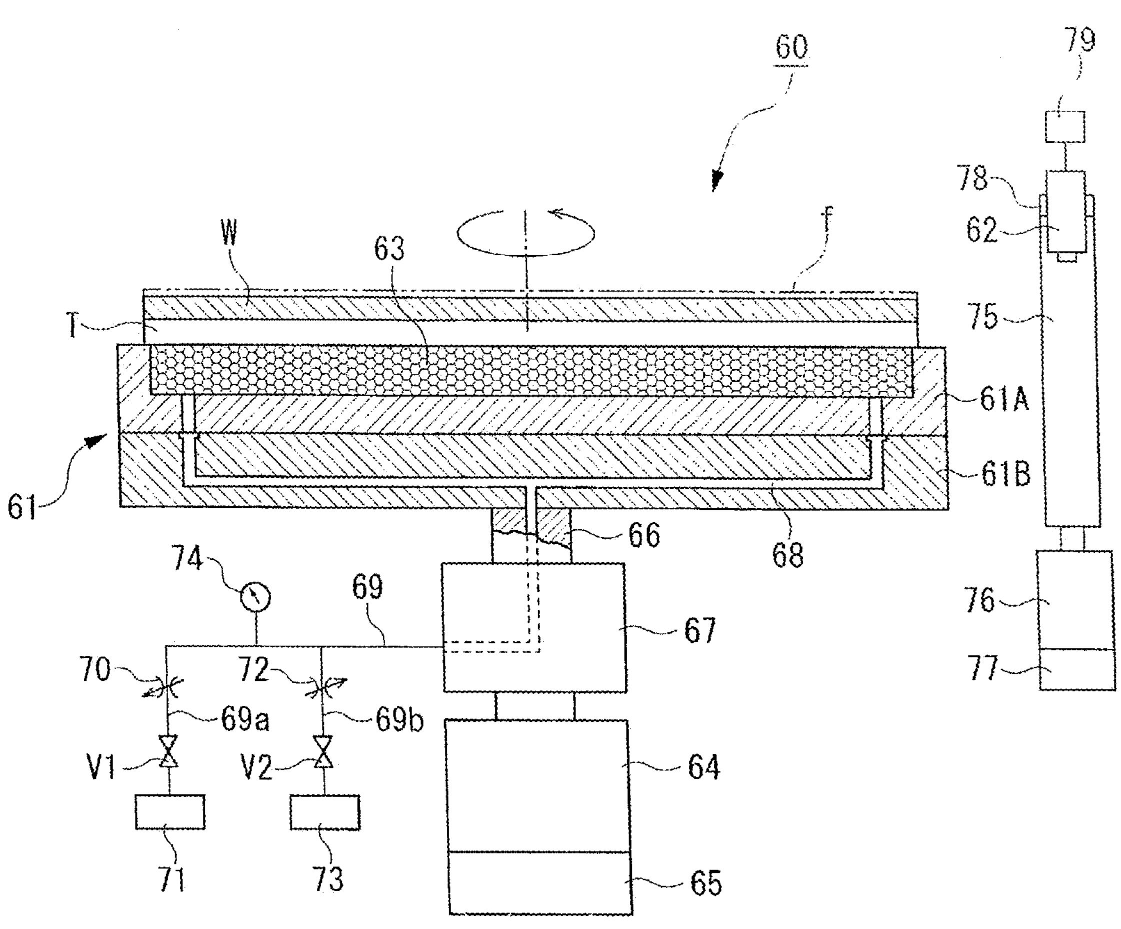
FIG. 6 is a side elevational view, partly in cross section, illustrating the water film forming step of the method of determining the hydrophilicity of a wafer according to the first aspect.

2) Water Film Forming Step:

The water film forming step is a step of forming a water film f (see FIG. 6) on the entire upper surface of the wafer W after the first image capturing step. Specifically, as illustrated in FIG. 5, the servomotor 76 of the cleaning unit 60 is energized to turn the rotatable shaft 75 and the turn arm 78 though the predetermined angle, causing the turn arm 78 and the nozzle 62 on its distal end to swing horizontally about the vertical central axis of the rotatable shaft 75 from the retracted position illustrated in FIG. 4 to the water supply position illustrated in FIG. 5 in which the nozzle 62 is positioned over a central area of the wafer W. Then, the water supply source 79 supplies water, i.e., pure water, to the nozzle 62, which drops the water through its water ejection port onto the central area of the wafer W on its upper surface. The water is dropped in a predetermined amount necessary to form a water film f having a predetermined thickness on the upper surface of the wafer W, as illustrated in FIG. 6.

After the predetermined amount of water has been supplied from the nozzle 62 to the central area of the upper surface of the wafer W, the servomotor 76 is reversed to turn the rotatable shaft 75 back through the predetermined angle, swinging back the turn arm 78 and the nozzle 62 to the retracted position clear of the cleaning table 61. Then, the servomotor 64 is energized to rotate the cleaning table 61 and the wafer W held thereon about their vertical central axis in the direction indicated by the arrow in FIG. 6 at a predetermined speed of 100 revolutions per minute for 10 seconds. The water supplied from the nozzle 62 to the central area of the upper surface of the wafer W is now uniformly spread radially outwardly toward the outer circumferential edge of the wafer W under centrifugal forces generated by the rotation of the wafer W, forming a water film f of uniform thickness on the upper surface of the wafer W, as illustrated in FIG. 6 (step S3 in FIG. 9). According to the present embodiments, the water film f is formed on the upper surface of the wafer W while it is being held on the cleaning table 61. However, the water film f may be formed on the upper surface of the wafer W while it is being held on the chuck table 10. The predetermined amount of water supplied to the central area of the upper surface of the wafer W may be large enough to overflow the upper surface of the wafer W, so that the water film f may be formed on the upper surface of the wafer W by removing the water that has overflowed the wafer W upon rotation of the cleaning table 61.

Figure 7:
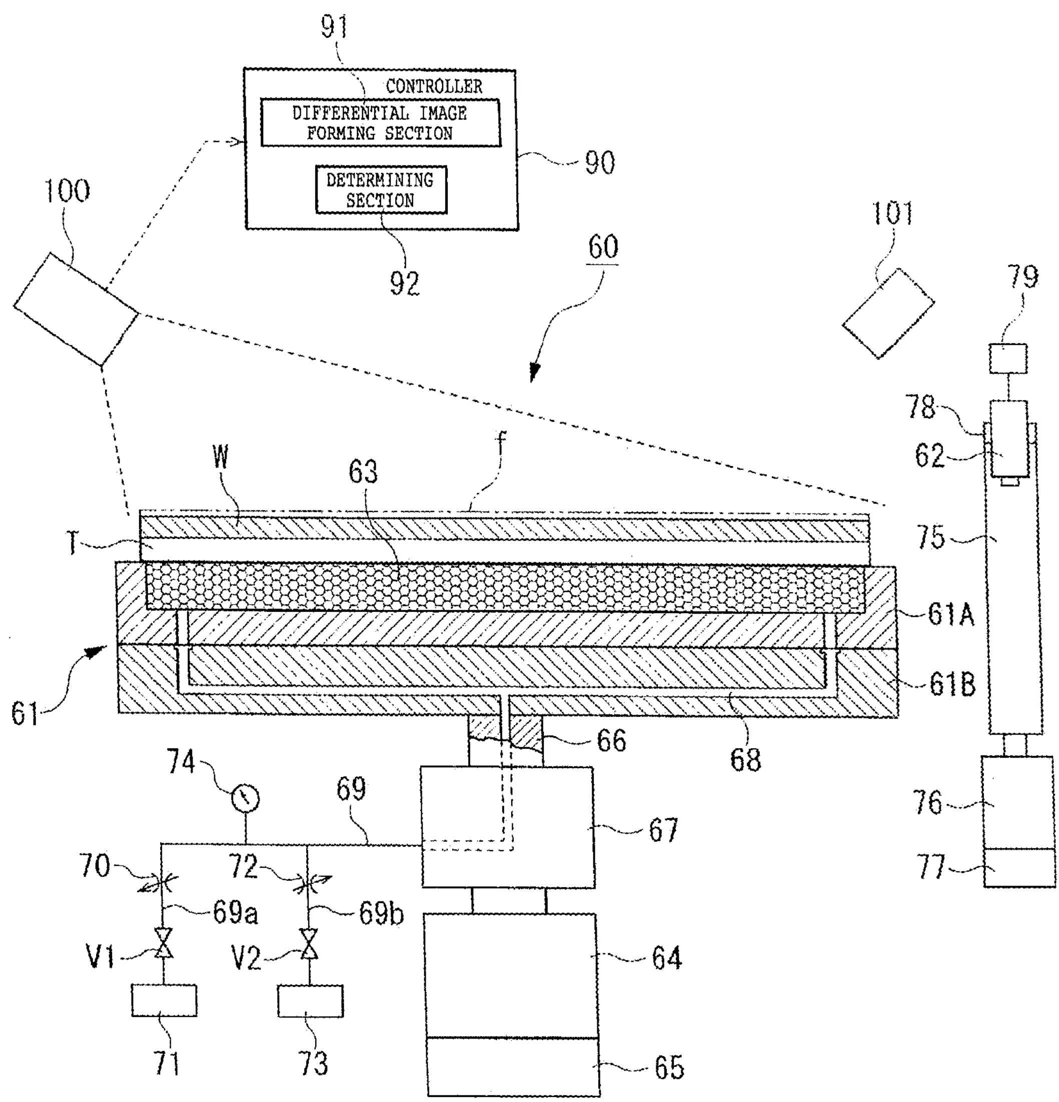
FIG. 7 is a side elevational view, partly in cross section, illustrating a second image capturing step of the method of determining the hydrophilicity of a wafer according to the first aspect.

3) Second Image Forming Step:

As illustrated in FIG. 7, the second image capturing step is a step of capturing, with the camera 100, a second image of the entire upper surface of the wafer W on which the water film f has been formed in the preceding step, i.e., the water film forming step. Specifically, in the second image capturing step, while the entire upper surface of the wafer W is being illuminated by the illuminating device 101 obliquely from above the wafer W, the camera 100 captures a second image of the entire upper surface of the wafer W obliquely from above the wafer W, and stores the second image in the storage unit of the controller 90 (step S4 in FIG. 9). In the second image capturing step, the nozzle 62 and the turn arm 78 are kept in the retracted position.

4) Differential Image Forming Step:

The differential image forming step is a step in which the differential image forming section 91 of the controller 90 forms a differential image based on the difference between lightness of the first image captured in the first image capturing step and lightness of the second image captured in the second image capturing step. Specifically, the differential image forming section 91 forms a differential image illustrated in FIG. 8A or 8B based on the difference between the levels of the lightness of the first and second images stored in the storage unit of the controller 90 (step S5 in FIG. 9).

Figure 8A:
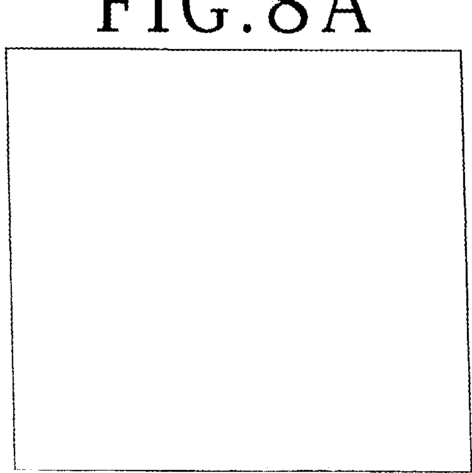
FIG. 8A is a diagram illustrating a differential image representing that the wafer is hydrophilic.
Figure 8B:
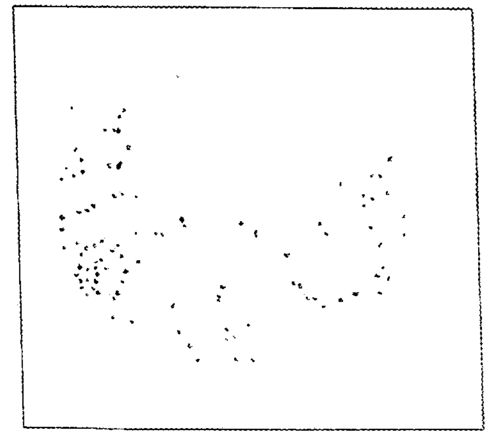
FIG. 8B is a diagram illustrating a differential image representing that the wafer is not hydrophilic.

5) Determining Step:

The determining step is a step of determining whether the entire upper surface of the wafer W is hydrophilic or not, i.e., whether hydrophilicity has been imparted on the entire upper surface of the wafer W or not, on the basis of the differential image formed in the preceding step, i.e., the differential image forming step. Specifically, the determining section 92 of the controller 90 determines whether the differential image is blank in its entirety or not (step S6 in FIG. 9). If the differential image is blank in its entirety as illustrated in FIG. 8A (step S6: Yes), then the determining section 92 determines that the entire upper surface of the wafer W is hydrophilic, and the controller 90 performs cutting processing on the wafer W (step S7 in FIG. 9). Conversely, if the differential image is not blank, i.e., if the differential image contains a portion that is not blank (step S6: No), then the determining section 92 determines that the entire upper surface of the wafer W is not hydrophilic, and the controller 90 returns the wafer W back into the cassette 6 (step S11 in FIG. 9), and puts an end to subsequent processing on the wafer W (step S10 in FIG. 9). The wafer W that has been returned to the cassette 6 for the lack of hydrophilicity on its face side will be irradiated again with ultraviolet rays or a plasma to make itself hydrophilic. Thereafter, the wafer W is again checked to determine whether its face side is hydrophilic or not in the manner described above, or is excluded from the group of workpieces to be processed. For example, the cutting apparatus 1 has a function to irradiate the wafers W stored in the cassette 6 with ultraviolet rays or a plasma. Alternatively, the cutting apparatus 1 may have a function to irradiate a wafer W unloaded from the cassette 6 with ultraviolet rays or a plasma to make the wafer W hydrophilic, and then to determine again whether its face side is hydrophilic or not.

According to the present embodiments, the determining section 92 of the controller 90 automatically determines whether the entire upper surface of the wafer W is hydrophilic or not on the basis of the differential image formed by the differential image forming section 91. However, the operator may determine whether the entire upper surface of the wafer W is hydrophilic or not by viewing the differential image.

If it is determined that the entire upper surface of the wafer W is hydrophilic according to the above method of determining the hydrophilicity of the wafer W (step S6 in FIG. 9: Yes), then the wafer W is cut as described above (step S7 in FIG. 9). A method of cutting the wafer W on the cutting apparatus 1 illustrated in FIG. 1 will be described below.

If it is determined that the entire upper surface of the wafer W is hydrophilic according to the above method of determining the hydrophilicity of the wafer W (step S6 in FIG. 9: Yes), then the wafer W is transferred from the cleaning table 61 to the second delivery mechanism 80. Specifically, the controller 90 opens the on-off valve V2 while keeping the on-off valve V1 closed, supplying air from the air supply source 73 via the branch pipe 69*b*, the pipe 69, and the fluid communication passage 68 to the porous member 63, from which the air is ejected upwardly. Therefore, the wafer W held on the cleaning table 61 is released together with the dicing tape T from the cleaning table 61.

The wafer W on the cleaning table 61 is held under suction on the suction pad 84 of the second delivery mechanism 80. The second delivery mechanism 80 is then moved in the −Y direction to deliver the wafer W to the chuck table 10, and places the wafer W onto the holding surface of the chuck table 10. The chuck table 10 that is connected to the suction source, not depicted, develops a negative pressure in its holding surface, so that the wafer W is held under suction on the holding surface with the dicing tape T facing downwardly against the holding surface.

Then, the X-axis moving mechanism, not depicted, moves the chuck table 10 and the wafer W held thereon along the X-axis until the chuck table 10 and the wafer W are positioned below the cutting units 30. Then, the cameras 31 that are combined with the respective cutting units 30 capture respective images of the face side of the wafer W. The images thus captured of the face side of the wafer W by the cameras 31 are processed according to a pattern matching, for example, thereby detecting projected dicing lines L1 (see FIG. 2) along which the wafer W is to be cut.

When the projected dicing lines L1 on the wafer W are detected, the positions along the Y-axis, i.e., the indexing feed directions, of the cutting blades 32 (see FIG. 1) of the cutting units 30 are indexed by the respective Y-axis moving mechanisms 50 until the positions along the Y-axis of the cutting blades 32 are aligned with the positions of the projected dicing lines L1 along which the wafer W is to be cut.

Then, the cutting blades 32 of the cutting units 30 as they are being rotated at a high speed are lowered a predetermined incising distance by the respective Z-axis moving mechanisms 40, and at the same time the chuck table 10 and the wafer W held thereon are moved along the X-axis, i.e., a cutting feed direction, by the X-axis moving mechanism, not depicted. The wafer W is now cut along the projected dicing lines L1 by the cutting blades 32 of the cutting units 30. When the wafer W has thus been cut along all the projected dicing lines L1, the chuck table 10 and the wafer W held thereon are turned 90° by the rotating mechanism, not depicted. Thereafter, the wafer W is cut along all the projected dicing lines L2 (see FIG. 2) that extend perpendicularly to the projected dicing lines L1 along which the wafer W has been cut. While the wafer W is being cut by the cutting blades 32, cutting water, i.e., pure water, is ejected to the cutting blades 32.

When the wafer W has been cut or divided along the projected dicing lines L1 and L2 that are arrayed in a grid, the wafer W is cleaned by the cleaning unit 60 (step S8 in FIG. 9). Specifically, the wafer W is held under suction by the suction pad 84 of the second delivery mechanism 80, and delivered from the chuck table 10 to the cleaning unit 60. The wafer W is then placed onto the holding surface of the cleaning table 61 of the cleaning unit 60 with the dicing tape T facing downwardly against the holding surface. The wafer W is held under suction on the holding surface of the cleaning table 61, and water, i.e., cleaning water, is ejected from the nozzle 62 positioned above the central area of the wafer W to the central area of the wafer W, and the cleaning table 61 with the wafer W held thereon is rotated about its vertical central axis in the direction indicated by the arrow in FIG. 6 at a predetermined speed.

Swarf deposited on the upper surface of the wafer W is washed away by the cleaning water. Since the entire upper surface of the wafer W has been determined as being hydrophilic by the determining method according to the present embodiments, the swarf is washed away together with the cleaning water and does not stay attached to the upper surface of the wafer W.

After the entire upper surface of the wafer W has been cleaned by the cleaning water, the wafer W is lifted off the cleaning table 61 and held under suction by the suction pad 84 of the second delivery mechanism 80, and transferred to the unloading and loading mechanism 7. The unloading and loading mechanism 7 that has received the wafer W holds the wafer W and stores the wafer W back into the cassette 6 (step S9 in FIG. 9), after which the determination of the hydrophilicity of the wafer W and the cutting of the wafer W come to an end (step S10 in FIG. 9).

In the method of determining the hydrophilicity of the wafer W according to the first aspect, as described above, if the differential image based on the difference between the lightness of the first image captured in the first image capturing step and the lightness of the second image captured in the second image capturing step contains a portion that is not blank, then it is determined that the entire upper surface of the wafer W is not hydrophilic. Conversely, if the differential image is blank, then it is determined that the entire upper surface of the wafer W is hydrophilic. Consequently, it is easy to confirm whether the entire upper surface of the wafer W is hydrophilic or not.

Moreover, the cutting apparatus 1 performs predetermined processing on the wafer W after it has been confirmed by the method of determining the hydrophilicity of the wafer W according to the first aspect that the entire upper surface of the wafer W is hydrophilic. After the predetermined processing has been performed on the wafer W, when the upper surface of the wafer W is cleaned by the cleaning unit 60, swarf produced from the wafer W by cutting the wafer W is reliably washed away by the cleaning water and is reliably prevented from being attached to the upper surface of the wafer W that has been processed.

Figures 10, 11:
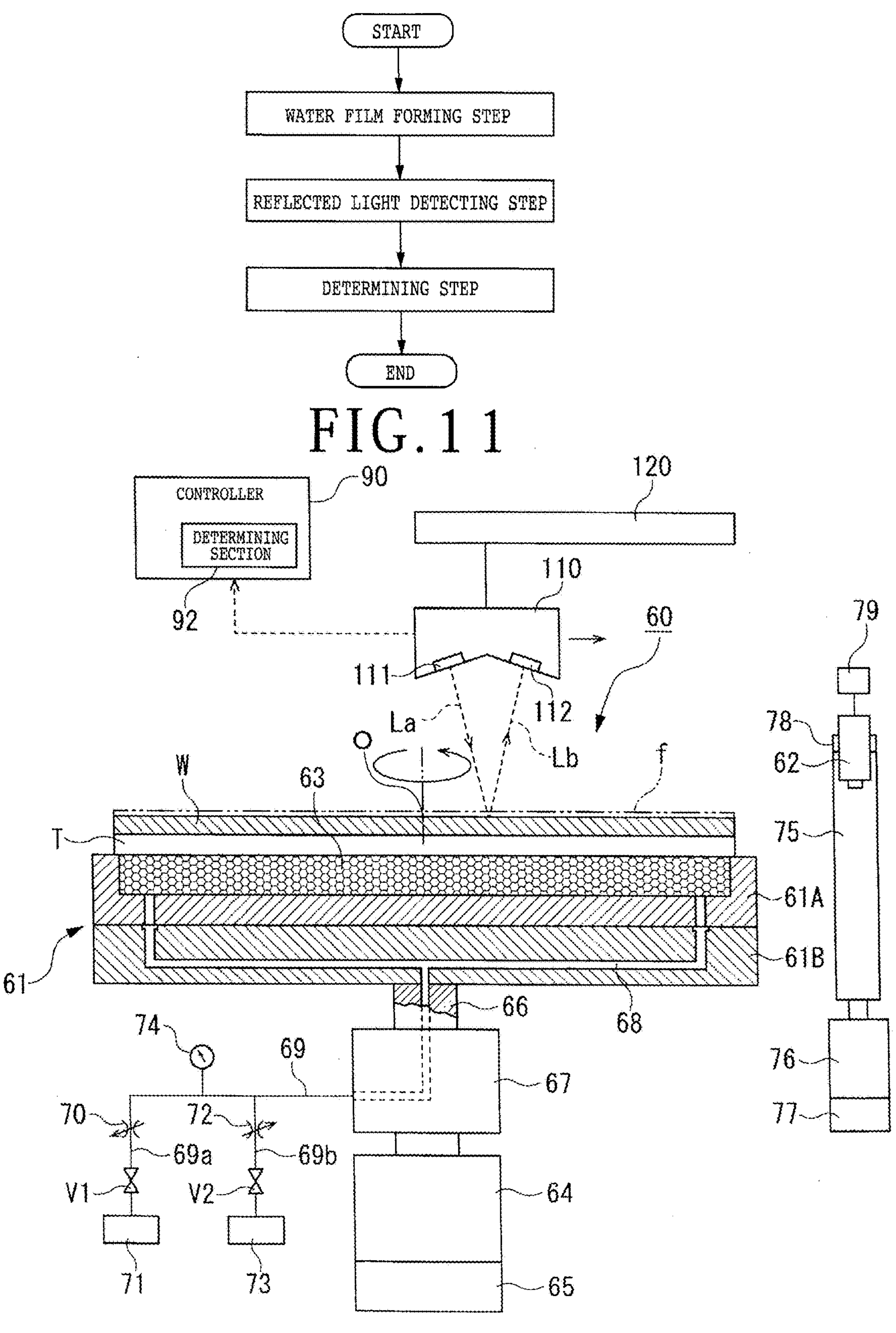
FIG. 10 is a flowchart illustrating a sequence of the steps of a method of determining the hydrophilicity of a wafer according to a second aspect of the present invention.
FIG. 11 is a side elevational view, partly in cross section, illustrating a reflected light detecting step of the method of determining the hydrophilicity of a wafer according to the second aspect.

A method of determining the hydrophilicity of a wafer W according to a second aspect of the present invention will be described below. The determining method according to the second aspect is also carried out by the cutting apparatus 1 illustrated in FIG. 1. As illustrated in FIG. 10, the determining method includes 1) a water film forming step, 2) a reflected light detecting step, and 3) a determining step that are performed successively to determine whether the entire upper surface of the wafer W is hydrophilic or not. The water film forming step, the reflected light detecting step, and the determining step will be described below with reference to FIGS. 11 through 14.

1) Water Film Forming Step:

The water film forming step is a step of forming a water film f illustrated in FIG. 6 on the entire upper surface of the wafer W held on the cleaning table 61 of the cleaning unit 60 illustrated in FIG. 1. In the water film forming step, the wafer W is held under suction on the holding surface of the cleaning table 61 with the dicing tape T facing downwardly against the holding surface of the cleaning table 61 (step S21 in FIG. 14).

Figure 14:
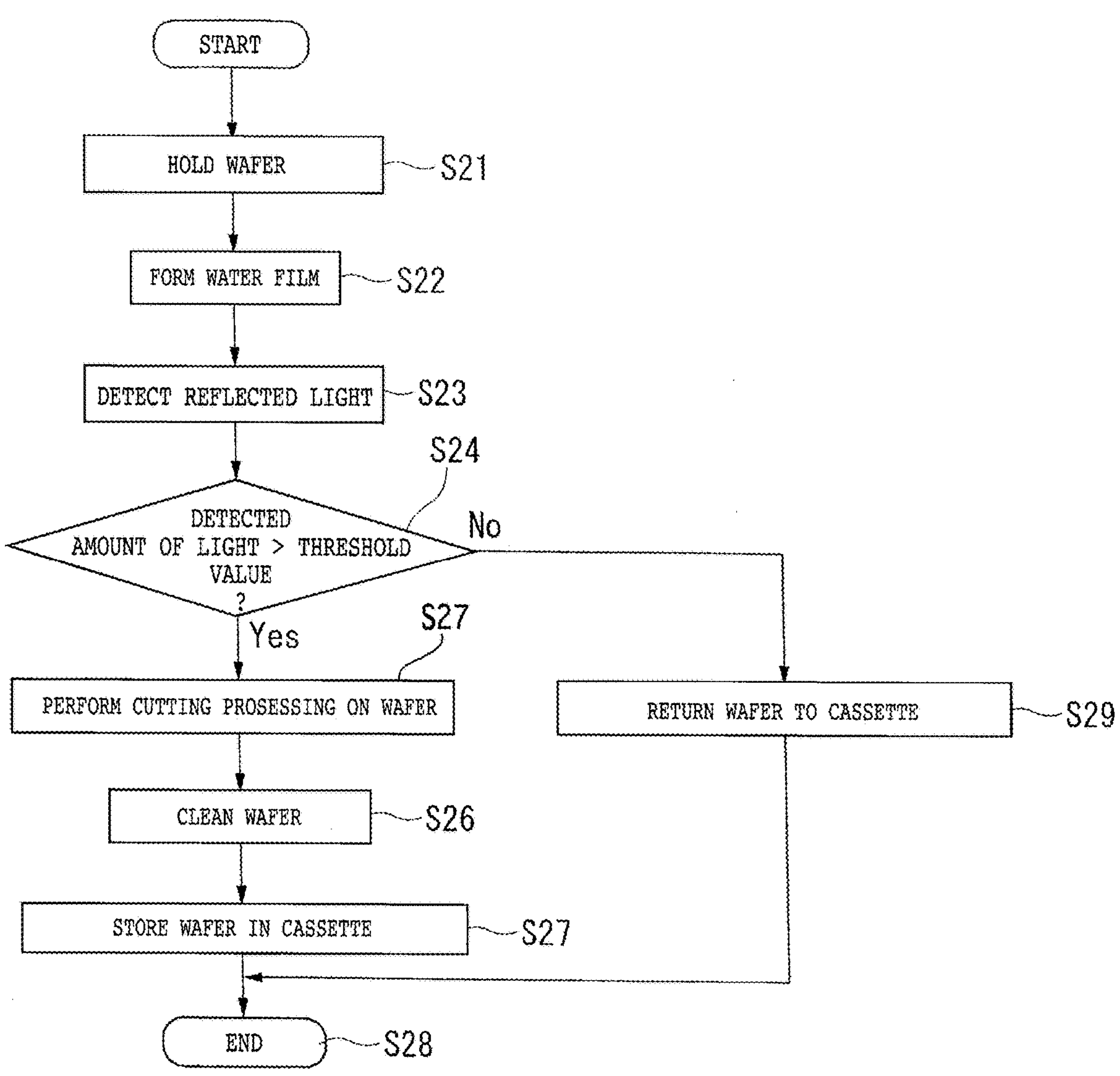
FIG. 14 is a flowchart illustrating a sequence of the steps of the method of determining the hydrophilicity of a wafer according to the second aspect and a cutting method.

Then, a predetermined amount of water is dropped onto the central area of the wafer W, and the wafer W is rotated about its central axis at a predetermined speed to spread the water supplied to the central area of the wafer W uniformly radially outwardly toward the outer circumferential edge of the wafer W under centrifugal forces generated by the rotation of the wafer W, forming a water film f of uniform thickness on the upper surface of the wafer W (step S22 in FIG. 14). The water film forming step is the same as the water film forming step of the determining method according to the first aspect (see FIGS. 5 and 6).

2) Reflected Light Detecting Step:

The reflected light detecting step is a step of, as illustrated in FIG. 11, rotating the cleaning table 61 and the wafer W held thereon about their central axis in the direction indicated by the arrow at a predetermined speed with the servomotor 64, moving a reflective sensor 110 in a horizontal direction parallel to the upper surface of the wafer W above the wafer W with a horizontally moving mechanism 120, and detecting, with a light detector 112 of the reflective sensor 110, reflected light Lb that is reflected by the upper surface of the wafer W and/or the water film f from measuring light La applied from a light emitter 111 of the reflective sensor 110 to the upper surface of the wafer W (step S23 in FIG. 14). Specifically, the reflective sensor 110 measures the amount of the reflected light Lb detected by the light detector 112 while moving horizontally from the position where the measuring light La emitted from the light emitter 111 is applied to the center O of the wafer W radially outwardly, i.e., rightwardly in FIG. 11, toward the outer circumferential edge of the wafer W. The reflective sensor 110 is electrically connected to the controller 90. The amount of the reflected light Lb measured by the reflective sensor 110 is transmitted to the controller 90 and stored in the storage unit. Those parts illustrated in FIG. 11 that are identical to those illustrated in FIG. 6 are denoted by identical reference characters, and will be omitted from detail description.

Figure 12A:
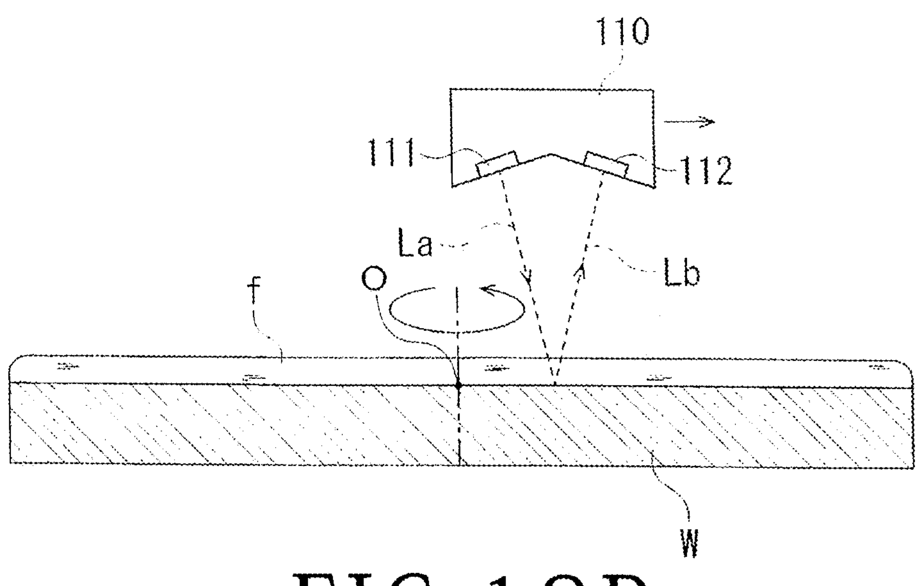
FIG. 12A is a side elevational view, partly in cross section, illustrating the manner in which reflected light is detected by a reflective sensor in a case where a face side of the wafer is hydrophilic.
Figure 12B:
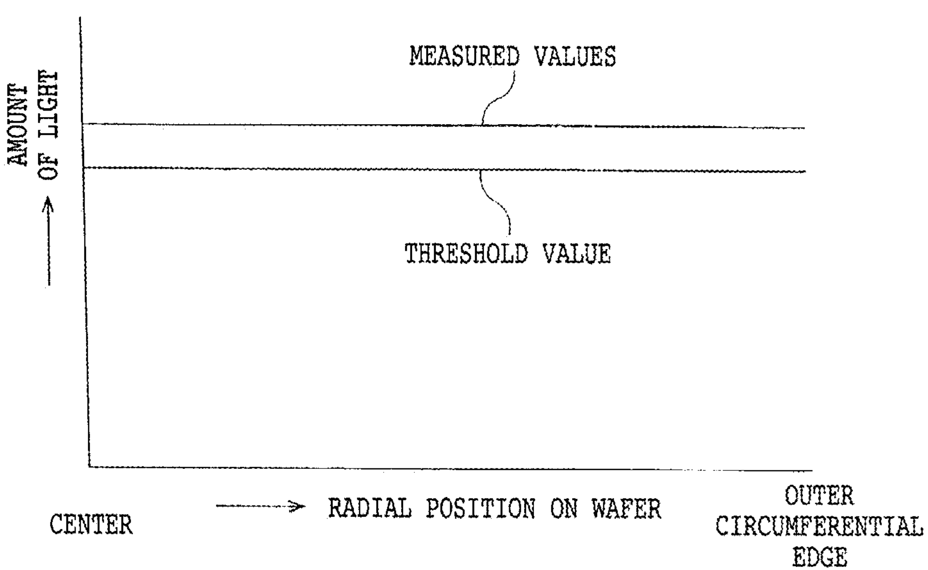
FIG. 12B is a diagram illustrating a relation between measured values of a detected amount of light in a radial direction of the wafer and a threshold value.

3) Determining Step:

The determining step is a step in which the determining section 92 of the controller 90 determines whether the upper surface of the wafer W is hydrophilic or not on the basis of the amount of the reflected light Lb detected by the light detector 112 of the reflective sensor 110. Specifically, the determining section 92 determines whether the amount of the reflected light Lb detected by the light detector 112 is higher or lower than a preset threshold value (step S24 in FIG. 14). For example, in a case where the water film f of uniform thickness has been formed on the entire upper surface of the wafer W, as illustrated in FIG. 12A, since the amount of the reflected light Lb detected by the light detector 112 is of a value higher than the threshold value radially along the wafer W (step S24: Yes), as illustrated in FIG. 12B, the determining section 92 determines that the entire upper surface of the wafer W is hydrophilic, and the controller 90 performs cutting processing on the wafer W (step S25 in FIG. 14). The reflective sensor 110, the horizontally moving mechanism 120, the servomotor 64 as a mechanism for rotating the cleaning table 61, and the determining section 92 of the controller 90 jointly make up a determining unit.

Figure 13A:
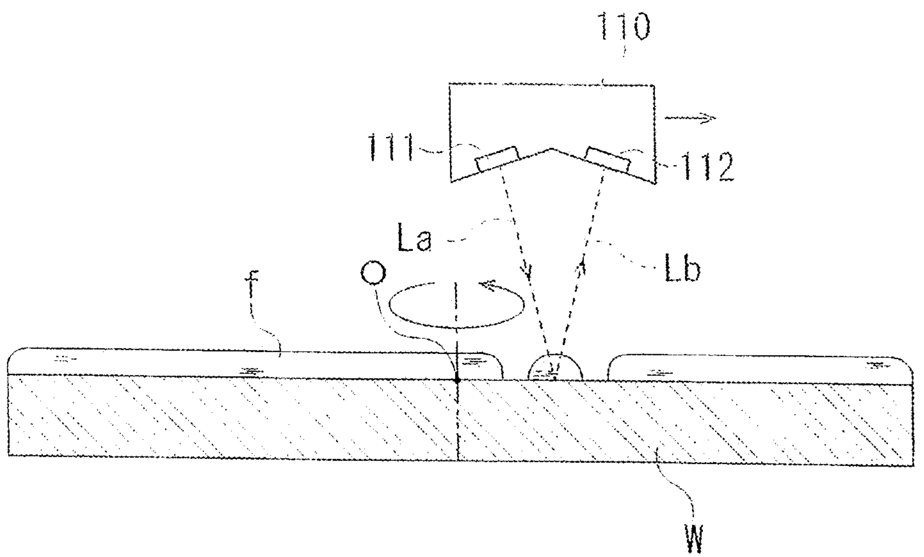
FIG. 13A is a side elevational view, partly in cross section, illustrating the manner in which reflected light is detected by the reflective sensor in a case where the face side of the wafer is not hydrophilic.
Figure 13B:
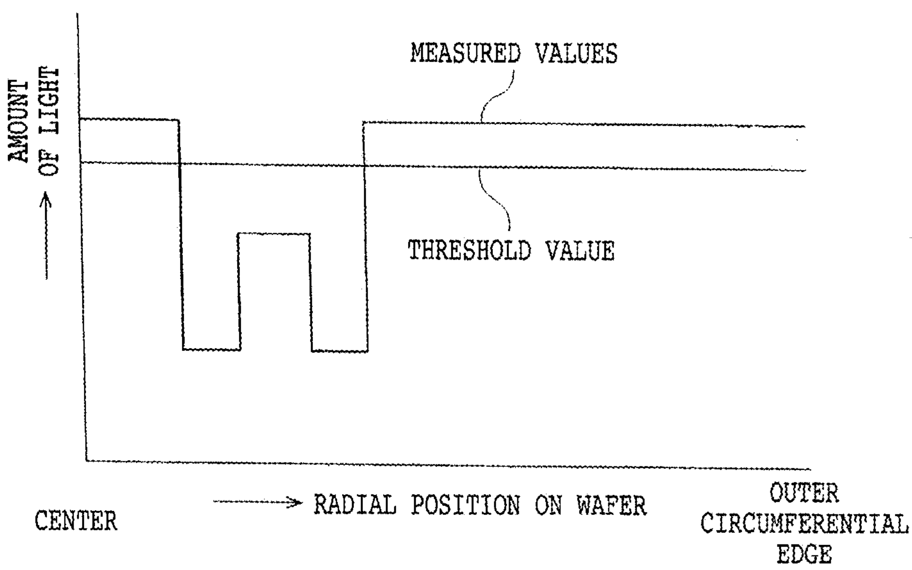
FIG. 13B is a diagram illustrating a relation between measured values of a detected amount of light in the radial direction of the wafer and the threshold value.

By contrast, in a case where the water film f formed on the upper surface of the wafer W is partly peeled off as illustrated in FIG. 13A, the detected amount of the reflected light Lb at the area where the water film f is peeled off is of a value lower than the threshold value (step S24: No), as illustrated in FIG. 13B. At this time, the determining section 92 determines that the upper surface of the wafer W is not hydrophilic, and the controller 90 returns the wafer W back into the cassette 6 (step S29 in FIG. 14), and puts an end to subsequent processing on the wafer W (step S28 in FIG. 14). The wafer W that has been returned to the cassette 6 for the lack of hydrophilicity on its face side is irradiated again with ultraviolet rays or a plasma to make itself hydrophilic. Thereafter, the wafer W is again checked to determine whether its face side is hydrophilic or not in the manner described above, or is excluded from the group of workpieces to be processed. As illustrated in FIGS. 11 through 13B, the light emitter 111 and the light detector 112 of the reflective sensor 110 are spaced from each other. However, the present invention is not limited to such details, but the reflective sensor may include a coaxial reflective sensor in which the light emitter 111 and the light detector 112 are disposed coaxially with each other.

According to the present embodiments, the determining section 92 of the controller 90 automatically determines whether the entire upper surface of the wafer W is hydrophilic or not on the basis of the amount of the reflected light Lb detected by the light detector 112 of the reflective sensor 110. However, the operator may determine whether the entire upper surface of the wafer W is hydrophilic or not by viewing the detected amount of the reflected light that may be indicated on a display unit, not depicted.

If it is determined that the entire upper surface of the wafer W is hydrophilic by the method of determining the hydrophilicity of the wafer W (step S24 in FIG. 14: Yes), then cutting processing is performed on the wafer W (step S25 in FIG. 14). The cutting processing has been described above and will be omitted from detailed description.

When the wafer W has been divided into a plurality of pieces along the projected dicing lines L1 and L2 (see FIG. 2) in the cutting processing, the wafer W is cleaned by the cleaning unit 60 (step S26 in FIG. 14). The cleaning of the wafer W has been described above and will be omitted from detailed description except that since the entire upper surface of the wafer W has been determined as being hydrophilic by the determining method according to the second aspect, the swarf is washed away together with the cleaning water and does not stay attached to the upper surface of the wafer W.

After the entire upper surface of the wafer W has been cleaned by the cleaning water, the wafer W is lifted off the cleaning table 61 of the cleaning unit 60 and held under suction by the suction pad 84 of the second delivery mechanism 80, and transferred to the unloading and loading mechanism 7. The unloading and loading mechanism 7 that has received the wafer W holds the wafer W and stores the wafer W back into the cassette 6 (step S27 in FIG. 14), after which the determination of the hydrophilicity of the wafer W and the cutting of the wafer W come to an end (step S28 in FIG. 14).

In the method of determining the hydrophilicity of the wafer W according to the second aspect, if the amount of light detected by the light detector 112 of the reflective sensor 110 is of a value higher than the preset threshold value in the reflected light detecting step, then the determining section 92 determines that the entire upper surface of the wafer W is hydrophilic, and if at least part of the detected light is of a value lower than the preset threshold value in the reflected light detecting step, then the determining section 92 determines that the entire upper surface of the wafer W is not hydrophilic. Consequently, it is easy to confirm whether the entire upper surface of the wafer W is hydrophilic or not.

Moreover, the cutting apparatus 1 performs predetermined cutting processing on the wafer W after it has been confirmed by the method of determining the hydrophilicity of the wafer W according to the second aspect that the entire upper surface of the wafer W is hydrophilic. After the cutting processing has been performed on the wafer W, when the upper surface of the wafer W is cleaned by the cleaning unit 60, swarf produced from the wafer W by cutting the wafer W is reliably washed away by the cleaning water and is reliably prevented from being attached to the upper surface of the wafer W that has been cut.

The present invention as it is applied to the cutting apparatus has been described above. However, the principles of the present invention are also applicable to various other processing apparatuses including a grinding apparatus and a polishing apparatus, for example.

Furthermore, the present invention is not limited to the embodiments described above, and various changes and modifications may be made therein without departing from the scope of the invention defined in the claims, description, and drawings thereof.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method of determining whether an entire upper surface of a wafer is hydrophilic or not, the method comprising:

a first image capturing step of capturing an image of the entire upper surface of the wafer with a camera;

a water film forming step of supplying an amount of water enough to form a water film on the entire upper surface of the wafer and rotating the wafer about an axis at a center of the wafer at a predetermined rotational speed;

after the water film forming step, a second image capturing step of capturing a second image of the entire upper surface of the wafer with the camera;

a differential image forming step of forming a differential image based on a difference between lightness of the first image captured in the first image capturing step and lightness of the second image captured in the second image capturing step; and a determining step of determining that the entire upper surface of the wafer is not hydrophilic if the differential image contains a portion that is not blank and that the entire upper surface of the wafer is hydrophilic if the differential image is blank.

2. A method of determining whether an entire upper surface of a wafer is hydrophilic or not, the method comprising:

a water film forming step of supplying an amount of water enough to form a water film on the entire upper surface of the wafer and rotating the wafer about an axis at a center of the wafer at a predetermined rotational speed;

after the water film forming step, a reflected light detecting step of moving a reflective sensor in a direction parallel to the upper surface of the wafer and simultaneously detecting reflected light that is reflected by the upper surface of the wafer or water on the upper surface of the wafer from measuring light applied from the reflective sensor to the wafer; and a determining step of determining that the entire upper surface of the wafer is hydrophilic if the amount of light detected by the reflective sensor in the reflected light detecting step is of a value higher than a preset threshold value and that the entire upper surface of the wafer is not hydrophilic if at least part of the detected amount of light is of a value lower than the threshold value.

3. A processing apparatus comprising:

a chuck table for holding a wafer thereon;

a processing unit for processing the wafer held on the chuck table;

a cleaning unit for cleaning an upper surface of the wafer by ejecting cleaning water to the upper surface of the wafer while rotating the wafer held on a cleaning table thereof;

a controller; and a determining unit for supplying water to a central area of the wafer held on the chuck table or the cleaning table, then rotating the chuck table or the cleaning table to form a water film on the entire upper surface of the wafer, and thereafter determining whether the entire upper surface of the wafer is hydrophilic or not.

4. The processing apparatus according to claim 3, wherein the determining unit includes a camera for capturing an image of the entire upper surface of the wafer held on the chuck table or the cleaning table and the controller, and the controller includes:

a differential image forming section for forming a differential image based on a difference between lightness of a first image captured of the wafer held on the chuck table or the cleaning table by the camera and lightness of a second image captured of the wafer held on the chuck table or the cleaning table by the camera, and a determining section for determining that the entire upper surface of the wafer is not hydrophilic if the differential image contains a portion that is not blank and that the entire upper surface of the wafer is hydrophilic if the differential image is blank.

5. The processing apparatus according to claim 3, wherein the determining unit includes:

a reflective sensor having a light emitter for emitting measuring light toward the upper surface of the wafer held on the chuck table or the cleaning table and a light detector for detecting reflected light that is reflected from the measuring light by the upper surface of the wafer or water on the upper surface of the wafer, a horizontally moving mechanism for moving the reflective sensor in a direction parallel to the upper surface of the wafer, a rotating mechanism for rotating the chuck table or the cleaning table, and a determining section for moving the reflective sensor in a horizontal direction with the horizontally moving mechanism while rotating the chuck table or the cleaning table with the rotating mechanism, and determining that the entire upper surface of the wafer is hydrophilic if the amount of the reflected light detected by the light detector is of a value higher than a preset threshold value and that the entire upper surface of the wafer is not hydrophilic if at least part of the amount of the reflected light is of a value lower than the threshold value.

* * * * *